United States Patent
Lee et al.

(10) Patent No.: US 7,537,673 B2
(45) Date of Patent: May 26, 2009

(54) PLASMA PROCESSING APPARATUS

(75) Inventors: Young Jong Lee, Sungnam-shi (KR);
Jun Young Choi, Seoul (KR); Hyun Hwan Ahn, Sungnam-shi (KR);
Chan-Ho Kang, Yongin-shi (KR);
Hyun-Woo Baek, Sungnam-shi (KR);
Young-Joo Hwang, Seoul (KR)

(73) Assignee: Advanced Display Processing Engineering Co., Ltd., Sungnam-Shi (KR)

( * ) Notice: Subject to any disclaimer, the term of this patent is extended or adjusted under 35 U.S.C. 154(b) by 226 days.

(21) Appl. No.: 11/219,956

(22) Filed: Sep. 6, 2005

(65) Prior Publication Data

US 2006/0048709 A1    Mar. 9, 2006

(30) Foreign Application Priority Data

Sep. 8, 2004  (KR)  ............... 10-2004-0071721

(51) Int. Cl.
*H01L 21/3065* (2006.01)
*C23C 16/00* (2006.01)
*C23C 16/458* (2006.01)
*C23C 16/50* (2006.01)

(52) U.S. Cl. ............... 156/345.54; 156/345.29; 156/345.31; 156/345.32; 156/345.52; 118/715; 118/719; 118/728; 118/729

(58) Field of Classification Search ............... 156/345, 156/345.29, 345.31, 345.32, 345.52, 345.54; 118/715, 719, 728, 729
See application file for complete search history.

(56) References Cited

U.S. PATENT DOCUMENTS

| | | | | | |
|---|---|---|---|---|---|
| 5,215,619 | A | * | 6/1993 | Cheng et al. | 156/345.42 |
| 5,344,542 | A | * | 9/1994 | Maher et al. | 204/298.15 |
| 5,772,770 | A | | 6/1998 | Suda et al. | |
| 6,251,188 | B1 | * | 6/2001 | Hashimoto et al. | 118/715 |
| 6,461,494 | B1 | * | 10/2002 | Batz et al. | 205/123 |
| 6,544,380 | B2 | * | 4/2003 | Tomoyasu et al. | 156/345.51 |
| 6,627,039 | B1 | * | 9/2003 | Siniaguine | 156/345.31 |
| 2004/0123952 | A1 | * | 7/2004 | Hur et al. | 156/345.31 |
| 2005/0103267 | A1 | * | 5/2005 | Hur et al. | 118/715 |
| 2006/0048709 | A1 | * | 3/2006 | Lee et al. | 118/715 |

FOREIGN PATENT DOCUMENTS

JP    2004182475 A  *  7/2004

* cited by examiner

*Primary Examiner*—Jeffrie R Lund
(74) *Attorney, Agent, or Firm*—Ked & Associates, LLP

(57) ABSTRACT

Disclosed herein is a plasma processing apparatus, which generates plasma within a vacuum chamber to process semiconductor substrates using the plasma. The apparatus comprises a substrate mounting table, an outer lifting bar, and a baffle. The outer lifting bar comprises a driving shaft, and a substrate supporting member coupled perpendicular to an upper end of the driving shaft. The baffle comprises a baffle plate coupled to the upper end of the driving shaft, and a shielding portion coupled to a lower surface of the baffle plate. The substrate supporting member is a foldable substrate supporting member. The baffle and the substrate supporting member are driven up and down at the same time by the driving shaft. As a result, it is possible to protect the substrate supporting member from plasma, and to prevent interference between the baffle and the outer lifting bar during operation of the plasma processing apparatus.

3 Claims, 10 Drawing Sheets

PLASMA PROCESSING APPARATUS

CROSS-REFERENCE TO RELATED APPLICATIONS

The present application claims priority under The Paris Convention for the Protection of Industrial Property to Korean Application No. 10-2004-0071721 filed on Sep. 8, 2004, which is incorporated herein by reference.

BACKGROUND OF THE INVENTION

1. Field of the Invention

The present invention relates to a plasma processing apparatus which generates plasma within a vacuum chamber to process semiconductor substrates using the plasma.

2. Description of the Related Art

Generally, as an apparatus for manufacturing semiconductor devices, liquid crystal displays, and the like, a plasma processing apparatus has been used to process a surface of a substrate using plasma. For example, the plasma processing apparatus includes a plasma etching apparatus for etching the substrate, a plasma chemical vapor deposition (CVD) apparatus for performing a CVD process on the substrate, and the like.

As shown in FIG. 1, such a plasma processing apparatus 1 comprises two planar electrodes 10 and 20 equipped in parallel to each other at upper and lower portions of chamber 14. A substrate S is mounted on the lower electrode 20. Thus, the lower electrode 20 is also referred to as a substrate mounting table. The upper electrode 10 is located opposite to the lower electrode 20. The upper electrode 10 is provided with an electrode plate 12 which has a plurality of gas orifices, and the electrode plate 12 is referred to as a shower head 14. The upper electrode 10 is connected to a process gas source. When performing a process, the process gas is supplied to a space between the two electrodes 10 and 20 through the gas orifices of the electrode plate 12. The process gas supplied to the space between the electrodes is converted into plasma by application of RF power to the electrodes, and the surface of the substrate is process by the plasma.

The plasma processing apparatus 1 is provided with an air discharge unit (not shown) to discharge gas therein to the outside. The air discharge unit is connected to a pump (not shown) located at the outside of the plasma processing apparatus 1 to suck and remove the gas in the plasma processing apparatus 1 and to maintain a vacuum in the plasma processing apparatus 1.

As shown in FIG. 1, such a plasma processing apparatus 1 comprises two planar electrodes 10 and 20 equipped in parallel to each other at upper and lower portions of chamber 14. A substrate S is mounted on the lower electrode 20. Thus, the lower electrode 20 is also referred to as a substrate mounting table. The upper electrode 10 is located opposite to the lower electrode 20. The upper electrode 10 is provided with an electrode plate 12 which has a plurality of gas orifices, and the electrode plate 12 is referred to as a shower head.

The outer lifting bar 40 is separately provided at the outside of the lower electrode 20. That is, the outer lifting bar 40 is provided in a space between a side surface of the lower electrode 20 and a wall of the plasma processing apparatus to move up and down.

The inner lifting pin 30 and the outer lifting bar 40 serve to convey the substrate into or out of the plasma processing apparatus. The operation of the inner lifting pin 30 and the outer lifting bar 40 will be briefly described as follows.

When conveying a substrate into the processing plasma processing apparatus from the outside, a conveying unit provided at the outside of the plasma processing apparatus enters the plasma processing apparatus. Then, the inner lifting pin 30 is raised to lift and support the substrate above the conveying unit. After the conveying unit is retracted from the plasma processing apparatus, the inner lifting pin 30 is lowered, and places the substrate on the lower electrode 20. In this state, a predetermined process is performed on the substrate using plasma.

After completing the process for the substrate, the inner lifting pin 30 is raised again to lift the substrate, and is stopped at a predetermined height. At the same time, the outer lifting bar 40 is also lifted, and a substrate supporting bar 44 is rotated towards the center of the lower electrode 20 and is located below the substrate at a lower height than that of the inner lifting pin 30. Then, as the substrate supporting bar 44 is raised, the substrate is lifted above the inner lifting pin 30 by the substrate supporting bar 44.

The inner lifting pin 30 is lowered again, and a new substrate is conveyed into the plasma processing apparatus by the conveying unit from the outside. Then, the inner lifting pin 30 is raised again to lift and support the new substrate. After the conveying unit is retracted from the plasma processing apparatus, the inner lifting pin 30 is lowered, and places the substrate on the lower electrode 20. Additionally, when the conveying unit enters the plasma processing apparatus again, the substrate supporting bar 44 is lowered, and transfers the processed substrate to the conveying unit. When the conveying unit is retracted from the plasma processing apparatus, the processed substrate is also conveyed out of the processing apparatus.

In FIG. 2, the conventional outer lifting bar 40 serving to convey the substrate as described above comprises an upper cover 42, the substrate supporting bar 44, and a case 46. The upper cover 42 is located above the substrate supporting bar 44. As a result, while the substrate supporting bar 44 is operated, the upper cover 42 is lowered to a side of the lower electrode 20, and prevents the plasma from attacking an upper surface of the substrate supporting bar 44 and damaging the substrate supporting bar 44. The substrate supporting bar 44 is raised above the lower electrode 20, and is then rotated towards the center of the lower electrode 20 to support the substrate. The case 46 is lowered during the process, and defines a space to receive the substrate supporting bar 44. The case 46 is tightly coupled with the upper cover 42 to prevent the plasma from attacking the side surface of the substrate supporting bar 44. However, since the case has a complicated structure, there are problems of increasing manufacturing costs while complicating maintenance of the plasma processing apparatus. Additionally, when the outer lifting bar 40 is driven, there is a possibility of collision between the upper cover and the case. Meanwhile, in addition to the outer lifting bar 40, a baffle 50 is provided to the side of the lower electrode 20 to control the flow of plasma. Thus, there are difficulties in manufacturing of the baffle 50, as such a recess must be formed on the baffle 50 to allow the case 46 to move through the recess as shown in FIG. 2, and in coupling of the case 46 to the baffle 50. Additionally, various particles can be accumulated in a gap between the baffle 50 and the case 46, causing process errors.

SUMMARY OF THE INVENTION

The present invention has been made to solve the above problems, and it is an object of the present invention to provide a plasma processing apparatus, which comprises an outer lifting bar to effectively block plasma.

In accordance with one aspect of the present invention, the above and other objects can be accomplished by the provision of a plasma processing apparatus for performing a predetermined process on a substrate using plasma in a vacuum state, comprising: a substrate mounting table equipped within the plasma processing apparatus to place a substrate thereon; an outer lifting bar provided at an outer side of the substrate mounting table to move up and down, and serving to temporarily support the substrate when placing the substrate on the substrate mounting table, the outer lifting bar comprising, a driving shaft driving up and down, and a substrate supporting member coupled perpendicular to an upper end of the driving shaft to pivot towards the substrate mounting table when loading the substrate; and a baffle provided to shield a space formed between the substrate mounting table and a wall of the plasma processing apparatus, and having a plurality of through holes formed on a predetermined portion of the baffle, the baffle comprising, a baffle plate coupled to the upper end of the driving shaft above the substrate mounting member to prevent the plasma from flowing to the space formed between the substrate mounting table and the wall of the plasma processing apparatus, and a shielding portion coupled to a lower surface of the baffle plate to surround the substrate supporting member, and opened at a side facing the substrate mounting table to allow the substrate supporting member to pivot through the open side of the shielding portion, wherein the baffle and the substrate supporting member are driven up and down at the same time by the driving shaft. As a result, the baffle is interconnected with the outer lifting bar to prevent interference between the baffle and the outer lifting bar, the height of the baffle is controlled to generate uniform plasma, and the outer lifting bar can be protected from the plasma with a simple structure of the plasma processing apparatus.

The substrate supporting member may be a foldable substrate supporting member comprising: an inner supporting bar coupled to the upper end of the driving shaft; an outer supporting bar coupled to a distal end of the inner supporting bar; a first joint coupling the inner supporting bar to the driving shaft to allow the inner supporting bar to pivot about the driving shaft; and a second joint coupling the inner supporting bar and the outer supporting bar to allow the outer supporting bar to pivot. As a result, the substrate can be supported to a central portion thereof by the substrate supporting member, enabling a large scale substrate to be easily processed using the plasma processing apparatus of the invention.

When the driving shaft is lowered, the shielding portion may be brought into tight contact with the substrate mounting table, and the substrate supporting member may be shielded in the space formed between the shielding portion and the wall of the substrate mounting table. As a result, the outer lifting bar is not influenced by the plasma during plasma processing.

The shielding portion may comprise a gate to open or close the open side of the shielding portion according to a driving procedure of the substrate supporting member, so that the substrate supporting member can be securely protected by the shielding portion.

The baffle may further comprise a resilient member fastened to a coupling portion between the gate and the shielding portion to allow the gate to return to a closing position via resilience of the resilient member, and the gate may be pushed to be opened by pivoting of the substrate supporting member, and be closed by restoring force of the resilient member.

The gate may further comprise a sensor to detect movement of the substrate supporting member; and a driving unit to open the gate when the movement of the substrate supporting member is detected by the sensor and to close the gate when the movement of the substrate supporting member is not detected by the sensor due to retraction of the substrate supporting member into the shielding portion.

In accordance with another aspect of the present invention, a plasma processing apparatus for performing a predetermined process on a substrate using plasma in a vacuum state is provided, comprising: a substrate mounting table equipped within the plasma processing apparatus to place a substrate thereon; an outer lifting bar provided at an outer side of the substrate mounting table to move up and down, and serving to temporarily support the substrate when placing the substrate on the substrate mounting table, the outer lifting bar comprising, a driving shaft driving up and down, a substrate supporting member coupled perpendicular to an upper end of the driving shaft to pivot towards the substrate mounting table when loading the substrate, and a shielding portion coupled to a wall of the substrate mounting table, opened at an upper surface, and having a space into which the outer lifting bar is lowered and inserted; and a baffle provided to shield a space formed between the substrate mounting table and a wall of the plasma processing apparatus, and having a plurality of through holes formed on a predetermined portion of the baffle, wherein the baffle and the substrate supporting member are driven vertically at the same time by the driving shaft. As a result, it is possible to prevent interference between the baffle and the outer lifting bar during a driving procedure of the outer lifting bar, and to prevent the outer lifting bar from being influenced by the plasma.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments of the present invention will be described in detail with reference to the accompanying drawings.

Embodiment 1

A plasma processing apparatus according to a first embodiment has the same structure and functions as those of the conventional plasma processing apparatus except for the structure and a driving procedure of an outer lifting bar and a baffle provided at a side of a substrate mounting table. Thus, description of other components will be omitted hereinafter, and the outer lifting bar and the baffle will be described in detail as follows.

An outer lifting bar 140 is provided at an outer side of a substrate mounting table 120, and serves to temporarily support a substrate when placing the substrate on the substrate mounting table 120. Thus, the outer lifting bar 140 according to the first embodiment is also provided to move up and down.

Figure 1:
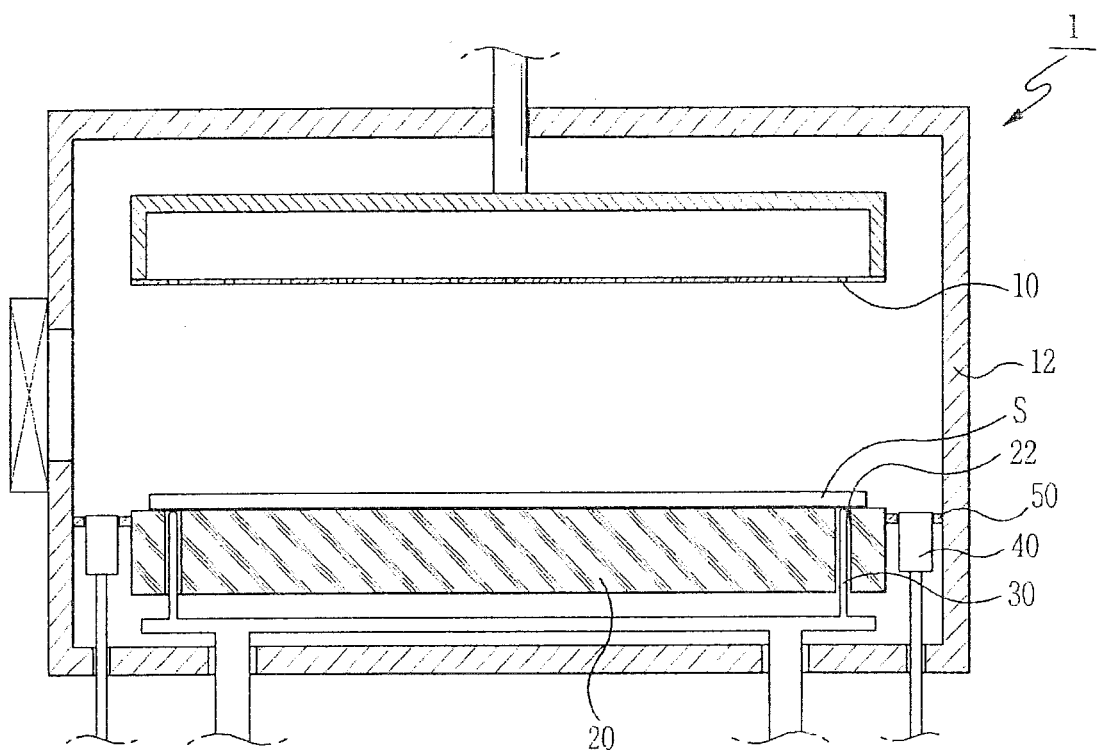
FIG. 1 is a cross-sectional view illustrating the structure of a conventional plasma processing apparatus.
Figure 2:
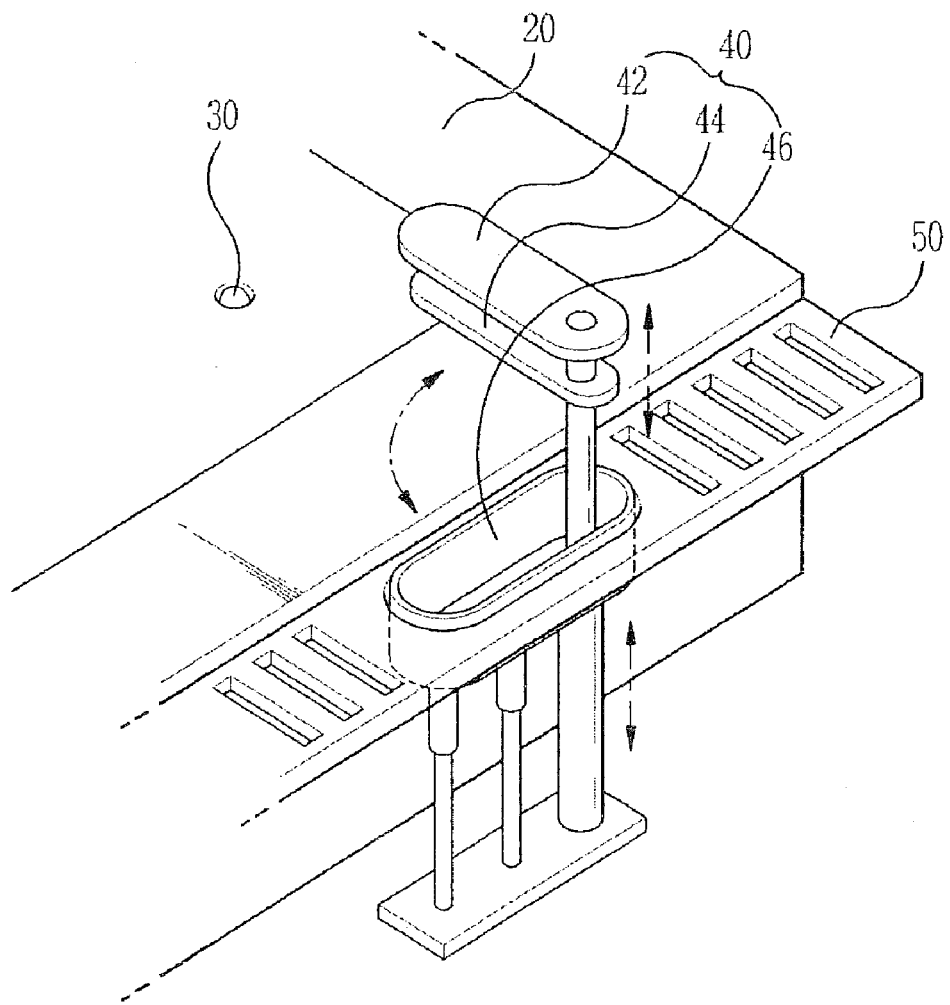
FIG. 2 is a perspective view illustrating the structure of an outer lifting bar of the conventional plasma processing apparatus.
Figure 3:
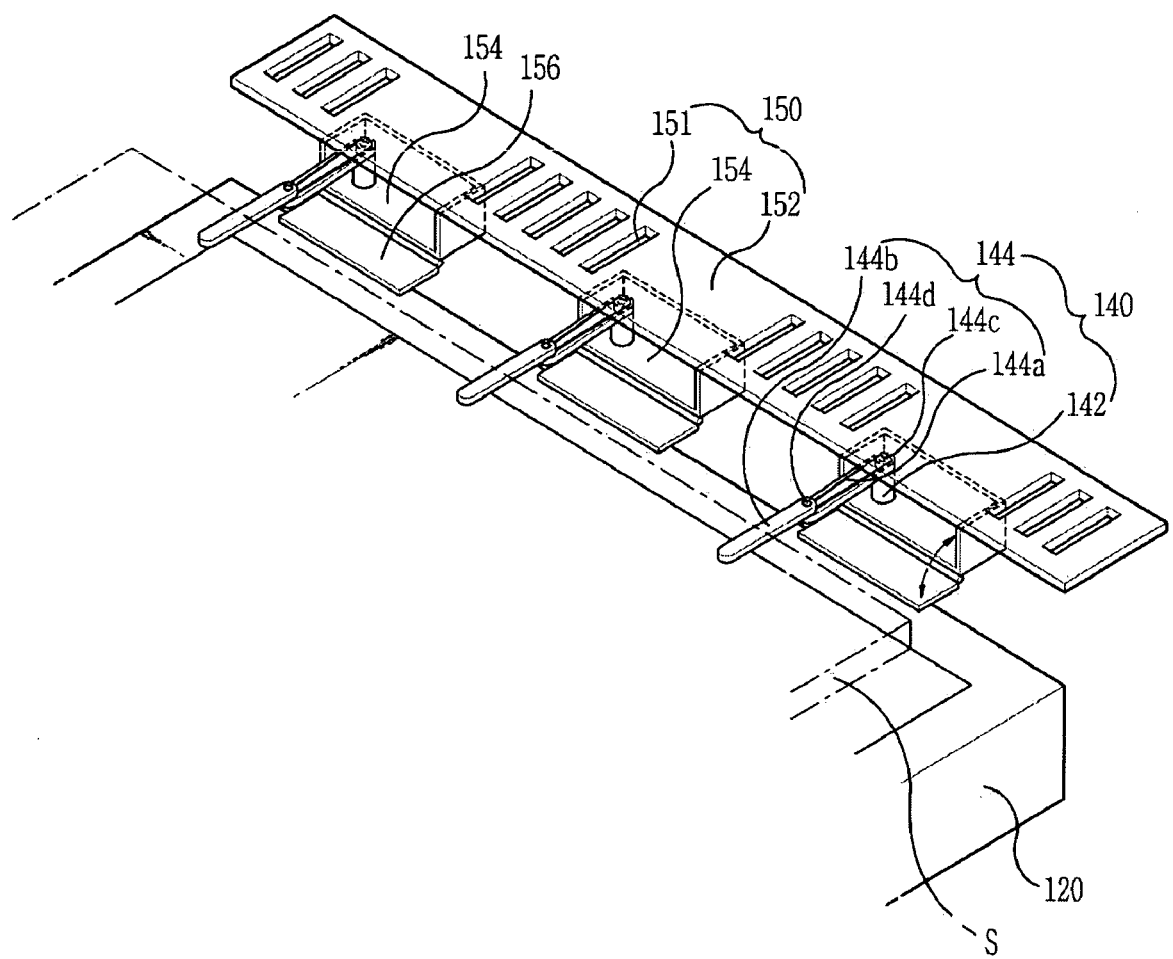
FIG. 3 is a perspective view illustrating the structure of an outer lifting bar and a baffle of a plasma processing apparatus according to a first embodiment of the present invention.

The outer lifting bar 140 comprises a driving shaft 142, and a substrate supporting member 144. The driving shaft 142 is coupled to a lower wall of the plasma processing apparatus to be driven up and down. Since the driving shaft 142 must be driven up and down while maintaining air tightness of the plasma processing apparatus, it is preferable that the driving shaft 142 be coupled to the lower wall of the plasma processing apparatus by a bellows member. Thus, a motor is provided to a lower portion at the outside of the plasma processing apparatus, and supplies power to the driving shaft 142 to drive the driving shaft 142 up and down. As shown in FIG. 3, preferably, two or more driving shafts 142 are provided at the side of the substrate mounting table 120 to stably support the substrate.

The substrate supporting member 144 is coupled perpendicular to an upper end of the driving shaft 142 such that it can pivot towards the substrate mounting table 120 when loading the substrate. That is, the substrate supporting member 144 remains in parallel to the side of the substrate mounting table 120 while the substrate supporting member 144 is driven up and down by the driving shaft 142. When the driving shaft 142 is completely raised so as to allow the substrate supporting member 144 to support the substrate, the substrate supporting member 144 pivots around the driving shaft 142 to a location perpendicular to the side of the substrate mounting table 120.

Here, the substrate supporting member 144 may be provided as a single member. However, if the substrate supporting member 144 supports only a periphery of the substrate, due to an increase in scale of the substrate processed by the plasma processing apparatus, a central portion of the substrate may sag. Thus, there is a problem of damaging the substrate during conveying the substrate in or out of the plasma processing apparatus. Accordingly, it is preferable for conveyance of the large scale substrate in and out of the plasma processing apparatus that the substrate supporting member 144 extend to the central portion of the substrate, if possible, to support the substrate. In this regard, if the substrate supporting member 144 is provided as the single member, the substrate supporting member 144 is significantly increased in length, and thus cannot pivot around the driving shaft 142 due to interference with the driving shaft of the outer lifting bar.

However, according to the first embodiment, the substrate supporting member 144 is provided as a foldable supporting member. That is, the substrate supporting member 144 comprises an inner supporting bar 144a, an outer supporting bar 144b, a first joint 144c, and a second joint 144d. The inner supporting bar 144a is a supporting bar vertically coupled to the upper end of the driving shaft 142. The inner supporting bar 144a is coupled to the upper end of the driving shaft 142 via the first joint 144c. That is, the first joint 144c enables the inner supporting bar 144a to be coupled to the upper end of the driving shaft and to pivot perpendicular to a driving direction of the driving shaft.

The outer supporting bar 144b is coupled to a distal end of the inner supporting bar 144a, and supports the central portion of the substrate. At this time, the outer supporting bar 144b is coupled to the distal end of the inner supporting bar 144a via the second joint 144d. The second joint 144d enables the outer supporting bar 144b to pivot therearound, as well as coupling the outer supporting bar 144b to the inner supporting bar 144a.

Accordingly, with the substrate supporting member 144 of the plasma processing apparatus of the first embodiment, the inner supporting bar 144a and the outer supporting bar 144b pivot to the center of the substrate mounting table 120, and support the central portion of the substrate. Additionally, when the substrate supporting member 144 is lowered, the outer supporting bar 144b pivots and overlaps with the inner supporting bar 144a, so that the length of the substrate supporting member 144 is folded in a half. As a result, there occurs no problem of interference with the adjacent outer lifting bar 140 or the driving shaft 142 during pivoting of the substrate supporting member 144.

The baffle 150 is provided for the purpose of preventing plasma from flowing at too high a speed to the side of the substrate mounting table 120 during the plasma processing on the substrate. That is, the baffle 150 serves to shield the flow of plasma in order to force the plasma to remain in a space between the two electrodes for a long period of time. The baffle 150 is provided to shield a space formed between the substrate mounting table 120 and the wall of the plasma processing apparatus, and has a plurality of through-holes 151 formed at predetermined portions of the baffle 120. At this time, the through-hole 151 is not formed on the baffle 150 where the baffle 150 has a shielding portion 154. As a result, since the plasma is discharged through the through-holes 151, it can be discharged at a significantly reduced speed.

According to the first embodiment, the baffle 150 comprises a baffle plate 152, and the shielding portion 154. The baffle plate 152 is a component for controlling the speed of the plasma by allowing the plasma to flow through the through-holes 151 formed in a predetermined pattern above the baffle 150. The baffle plate 152 is coupled to the upper end of the driving shaft 142 on the substrate mounting member 144, and prevents the plasma from flowing to the space formed between the substrate mounting table 120 and the wall of the plasma processing apparatus.

The shielding portion 154 is coupled to a lower surface of the baffle plate 152 to surround the substrate supporting member 144, and is opened at one side facing the side of the substrate mounting table 120 to allow the substrate supporting member 144 to pivot through the open side. That is, the shielding portion 154 is coupled to the lower surface of the baffle plate 152, and defines a space together with the baffle plate 152 and the side of the substrate mounting table 120, so that the substrate supporting member 144 can be shielded in the space. With this structure, the baffle 150 serves to protect the substrate supporting member 144 from the plasma. According to the first embodiment, the shielding portion 154 can be welded to the baffle plate 152, or can be joined to the baffle plate 152 with an additional coupling means. The coupling means may include bolts and the like.

The baffle 150 is preferably provided with a gate 156 to open or close the open side of the shielding portion 154. As shown in FIG. 3, the gate 156 constitutes the side of the shielding portion 154 facing the side of the substrate mounting table 120, and has an opening/closing structure to allow the substrate supporting member 144 to pivot therethrough. At this time, the gate 156 is coupled at one edge to the shielding portion 154, and pivots about the edge to open or close the side of the shielding portion 154. The baffle 150 further comprises a resilient member provided to a coupling portion between the gate 156 and the shielding portion 154. As a result, according to the first embodiment, the gate 156 is pushed and opened by the substrate supporting member 144 when the substrate supporting member 144 pivots above the substrate mounting table 120. When external force is not applied to the gate 156, the gate 156 is automatically closed by restoring force of the resilient member.

Additionally, the gate further comprises a sensor to detect movement of the substrate supporting member 144, and a driving unit to open the gate according to the movement of the substrate supporting member 144. That is, when the substrate supporting member 144 is suitably located in the shielding portion 154, the sensor cannot detect the movement of the substrate supporting member 144, and then the driving unit is driven to close the gate. On the contrary, when the substrate supporting member 144 is deviated from its location within the shielding portion 154, the sensor detects the movement of the substrate supporting member 144, and then the driving unit is driven to open the gate. Thus, while the substrate supporting member 144 pivots and continues to support the substrate, the sensor continues to detect the substrate supporting member 144, so that the gate 156 is maintained in an opened state. Then, when the substrate supporting member 144 is returned to, and is seated in the shielding portion 154, the sensor cannot detect the substrate supporting member 144, so that the gate 156 is closed.

Accordingly, in the first embodiment, the baffle 150 and the substrate supporting member 144 are simultaneously driven up and down by the driving shaft 142. In other words, when the substrate supporting member 144 is raised to support the substrate, the baffle 150 is also raised. Additionally, during plasma processing of the substrate, the baffle 150 is lowered to the space between the substrate mounting table 120 and the wall of the plasma processing apparatus to avoid the flow of the plasma. At this time, since the height of the baffle 150 can be freely adjusted, there is an advantage in that the substrate can be processed while adjusting the height of the baffle 150 in order to achieve suitable flow of the plasma.

Additionally, according to the first embodiment, since the baffle 150 and the outer lifting bar 140 are simultaneously driven, there is no possibility of interference between the outer lifting bar 140 and the baffle 150 or the substrate supporting member 144 during the driving procedure of the outer lifting bar 140, and there is no need to employ a complicated apparatus to drive the outer lifting bar 140. As a result, there is an advantage of simplifying the overall structure of the plasma processing apparatus.

A driving procedure of the outer lifting bar and the baffle of the plasma processing apparatus according to the first embodiment will be described with reference to FIGS. 4a to 4c.

Figure 4A:
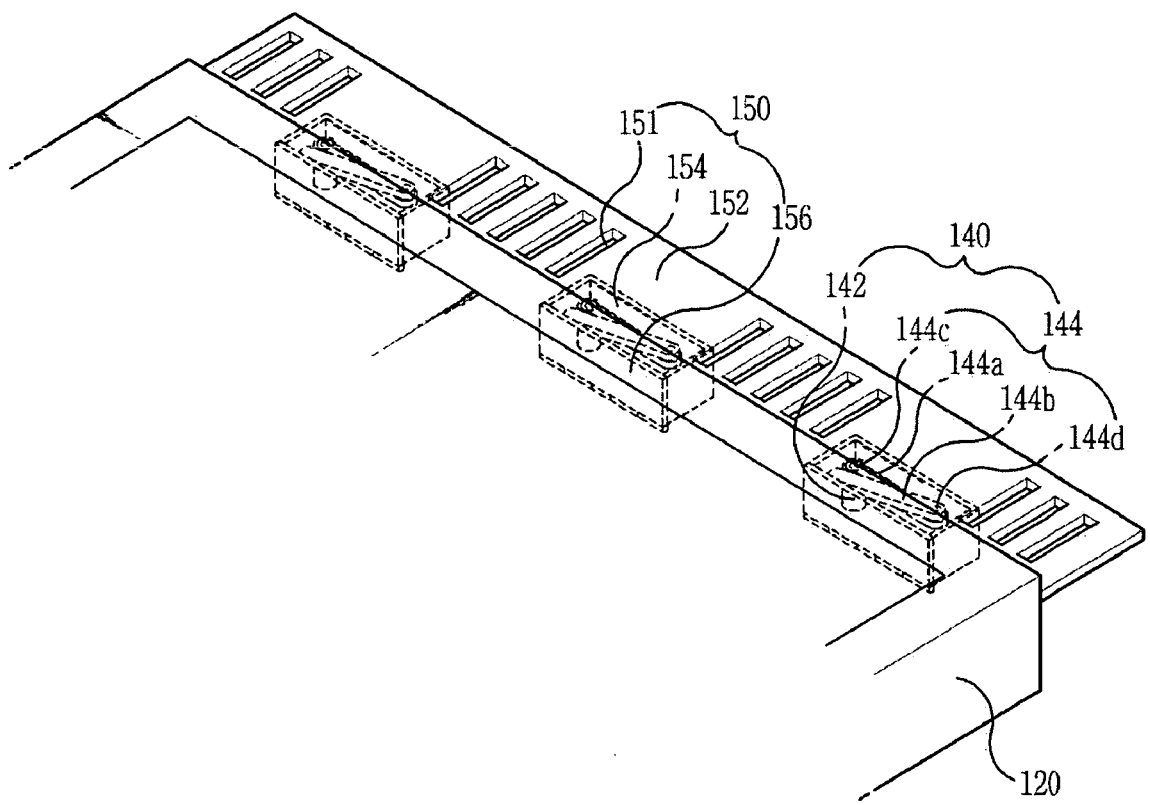
FIGS. 4a to 4c are views illustrating a driving procedure of the outer lifting bar and the baffle of the plasma processing apparatus according to the first embodiment.

As shown in FIG. 4a, the outer lifting bar 140 and the baffle 150 remain at the side of the substrate mounting table 120 during plasma processing. At this time, with the outer supporting bar 144b overlapping with an inner supporting bar 144a, the substrate supporting member 144 is shielded in the space defined by the shielding portion 154, the baffle 150 and the substrate mounting table 120. The baffle 150 is positioned at a suitable location to control flow of plasma.

Figure 4B:
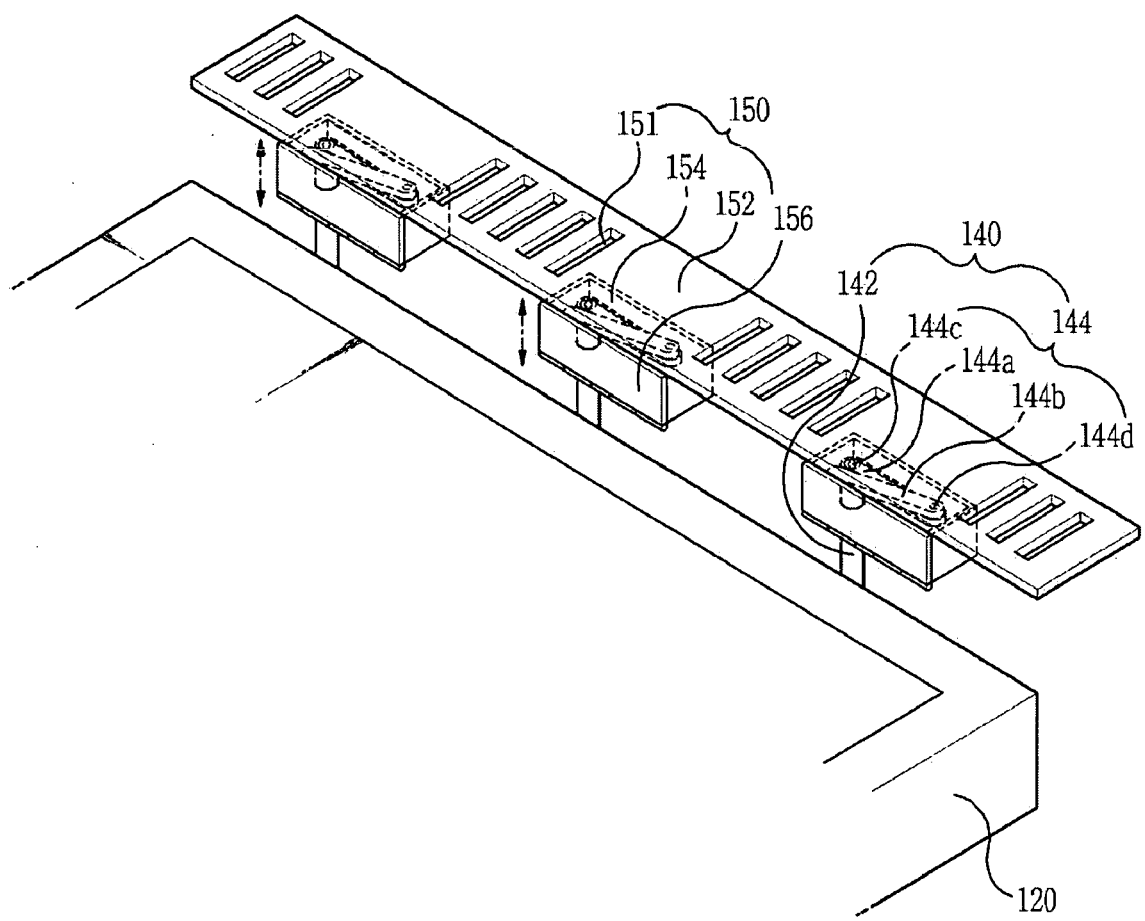

After plasma processing is completed, and a process gas is discharged through a discharge system, the driving shaft 142 is driven to raise the substrate supporting member 144 and the baffle 150, as shown in FIG. 4b.

Figure 4C:
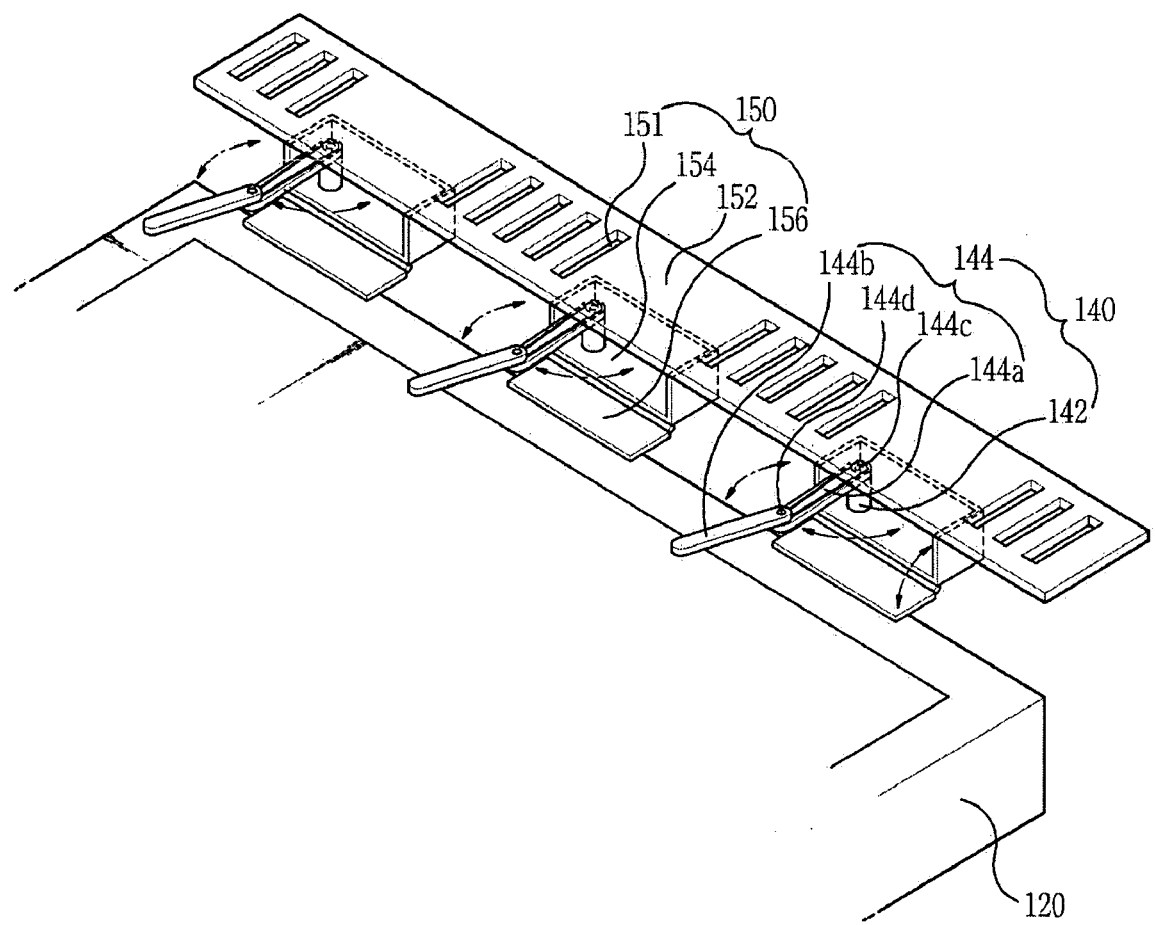

When the substrate supporting member 144 is completely raised to a height to support the substrate, the substrate supporting member 144 is driven to pivot the inner supporting bar 144a and the outer supporting bar 144b, as shown in FIG. 4c. As such, when the substrate supporting member 144 starts to be driven, the sensor detects movement of the substrate supporting member 144, and activates the driving unit. As a result, the gate 156 is opened to enable the substrate supporting member 144 to pivot without interference with other components. At this time, the inner supporting bar 144a pivots 90 degrees to the driving shaft, and the outer supporting bar 144b pivots 180 degrees to the second joint. Thus, if a pivoting speed of the outer supporting bar 144b is increased to twice the pivoting speed of the inner supporting bar 144a, the outer supporting bar 144b pivots to a location inline with the inner supporting bar 144a when the inner supporting bar 144a pivots to a location perpendicular to the side surface of the substrate mounting table 120.

With this procedure, the substrate supporting member 144 is completely unfolded, and serves to convey the substrate in or out while supporting the substrate. After completing conveyance of the substrate, the outer lifting bar 140 and the baffle 150 return to their original locations at the side of the substrate mounting table 120 via the inverse of the procedure described above.

Embodiment 2

A plasma processing apparatus according to a second embodiment has the same structure and functions as those of the plasma processing apparatus according to the first embodiment except for the structure and a driving procedure of an outer lifting bar and a baffle provided at a side of a substrate mounting table. Thus, description of other components will be omitted hereinafter, and the outer lifting bar and the baffle will be described in detail as follows.

An outer lifting bar 240 is provided at an outer side of a substrate mounting table 220, and serves to temporarily support a substrate when placing the substrate on the substrate mounting table 220. Thus, the outer lifting bar 240 according to the second embodiment is also provided to move up and down.

The outer lifting bar 240 comprises a driving shaft 242, a substrate supporting member 244, and a shielding portion 246. The driving shaft 242 is coupled to a lower wall of the plasma processing apparatus to be driven up and down. Since the driving shaft 242 must be driven up and down while maintaining air tightness of the plasma processing apparatus, it is preferable that the driving shaft 242 is coupled to the lower wall of the plasma processing apparatus by a bellows member. Thus, a motor is provided to a lower portion at the outside of the plasma processing apparatus, and supplies power to the driving shaft 242 to drive the driving shaft 242 up and down. As shown in FIG. 7, preferably, two or more driving shafts 242 are provided at the side of the substrate mounting table 220 to stably support the substrate.

The substrate supporting member 244 is coupled perpendicular to an upper end of the driving shaft 242 such that it can pivot towards the substrate mounting table 220 when loading the substrate. That is, the substrate supporting member 244 remains in parallel to the side of the substrate mounting table 220 while the substrate supporting member 144 is driven up and down by the driving shaft 242. When the driving shaft 242 is completely raised to a location to allow the substrate supporting member 244 to support the substrate, the substrate supporting member 244 pivots around the driving shaft 242 to a location perpendicular to the side of the substrate mounting table 220.

As with the first embodiment, according to the second embodiment, the substrate supporting member 244 is provided as a foldable supporting member to allow easy support of a large scale substrate.

Figure 5:
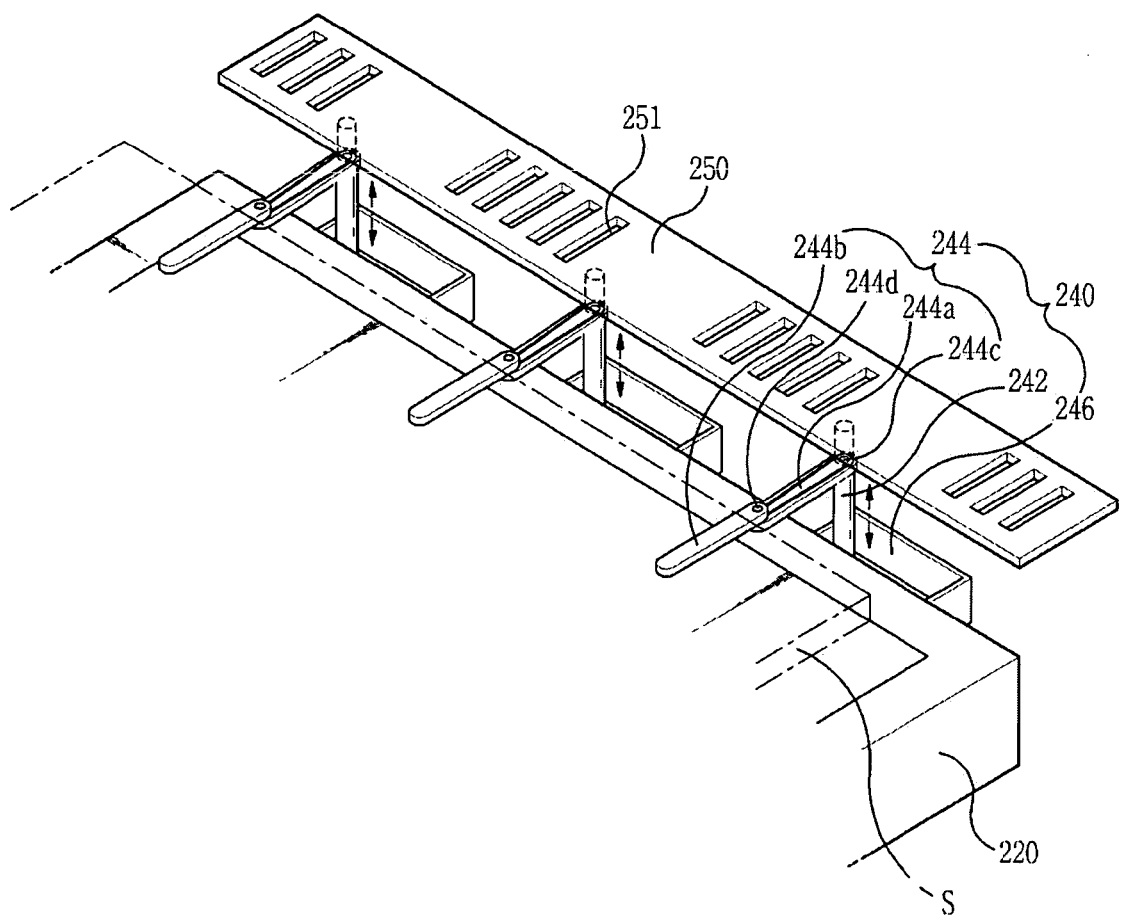
FIG. 5 is a perspective view illustrating the structure of an outer lifting bar and a baffle of a plasma processing apparatus according to a second embodiment of the present invention.

Next, as shown in FIG. 5, the shielding portion 246 is attached to a predetermined portion of the side surface of the substrate mounting table 220. The number and location of the shielding portions 246 corresponds to those of the driving shaft 242. Additionally, since the shielding portion 246 provides a space to receive the substrate supporting member 244 during plasma processing on the substrate, it has a size to receive the substrate supporting member 244 as a matter of course.

The baffle 250 is provided for the purpose of preventing plasma from flowing at too high a speed to the side of the substrate mounting table 220 during the plasma processing on the substrate. That is, the baffle 250 serves to shield the flow of plasma in order to force the plasma to remain in a space between two electrodes for a long period of time. The baffle 250 is provided to shield a space formed between the substrate mounting table 220 and the wall of the plasma processing apparatus, and has a plurality of through-holes 251 formed at predetermined portions of the baffle 220. At this time, the through-hole 251 is not formed on the baffle 250 where the baffle 250 has a shielding portion 246. As a result, since the plasma is discharged through the through-holes 251, it can be discharged at a significantly reduced speed.

According to the second embodiment, the baffle 250 and the substrate supporting member 244 are driven vertically at the same time by the driving shaft 242. In other words, when the substrate supporting member 244 is raised to support the substrate, the baffle 250 is also raised. Additionally, during plasma processing of the substrate, the baffle 250 is lowered to the space between the substrate mounting table 220 and the wall of the plasma processing apparatus to avoid the flow of the plasma. At this time, since the height of the baffle 250 can be freely adjusted in the second embodiment, there is an advantage in that the substrate can be processed while adjusting the height of the baffle 250 in order to achieve suitable flow of the plasma.

Additionally, according to the second embodiment, since the baffle 250 and the outer lifting bar 240 are simultaneously driven, there is no possibility of interference between the outer lifting bar 240 and the baffle 250 or the substrate supporting member 244 during the driving procedure of the outer lifting bar 240, and there is no need to employ a complicated apparatus to drive the outer lifting bar 240. As a result, there is an advantage of simplifying the overall structure of the plasma processing apparatus.

A driving procedure of the outer lifting bar and the baffle of the plasma processing apparatus according to the second embodiment will be described with reference to FIGS. 6a to 6c.

Figure 6A:
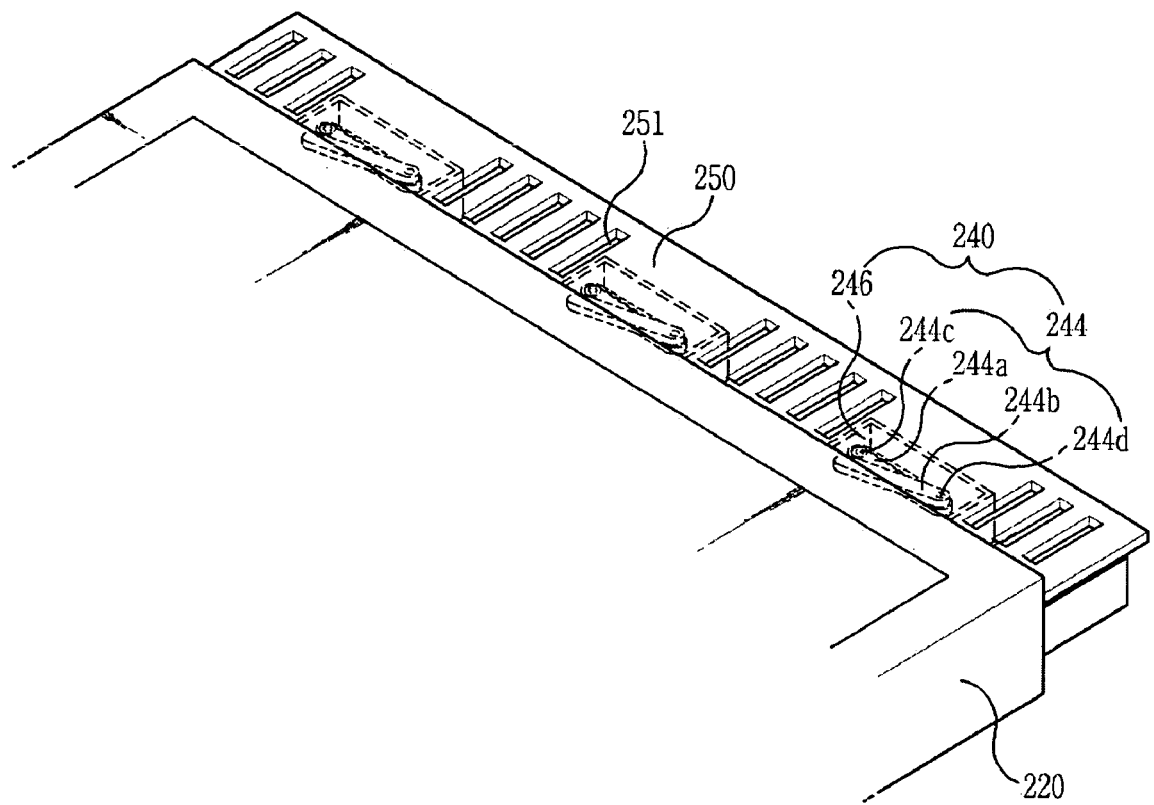
FIGS. 6a to 6c are views illustrating a driving procedure of the outer lifting bar and the baffle of the plasma processing apparatus according to the second embodiment.

As shown in FIG. 6a, the outer lifting bar 240 and the baffle 250 remain at the side of the substrate mounting table 220 during plasma processing. At this time, with the outer supporting bar 244b overlapping with inner supporting bar 244a, the substrate supporting member 244 is shielded in the space defined by the shielding portion 246, the baffle 250 and the substrate mounting table 220. The baffle 250 is positioned at a suitable location to control flow of plasma.

Figure 6B:
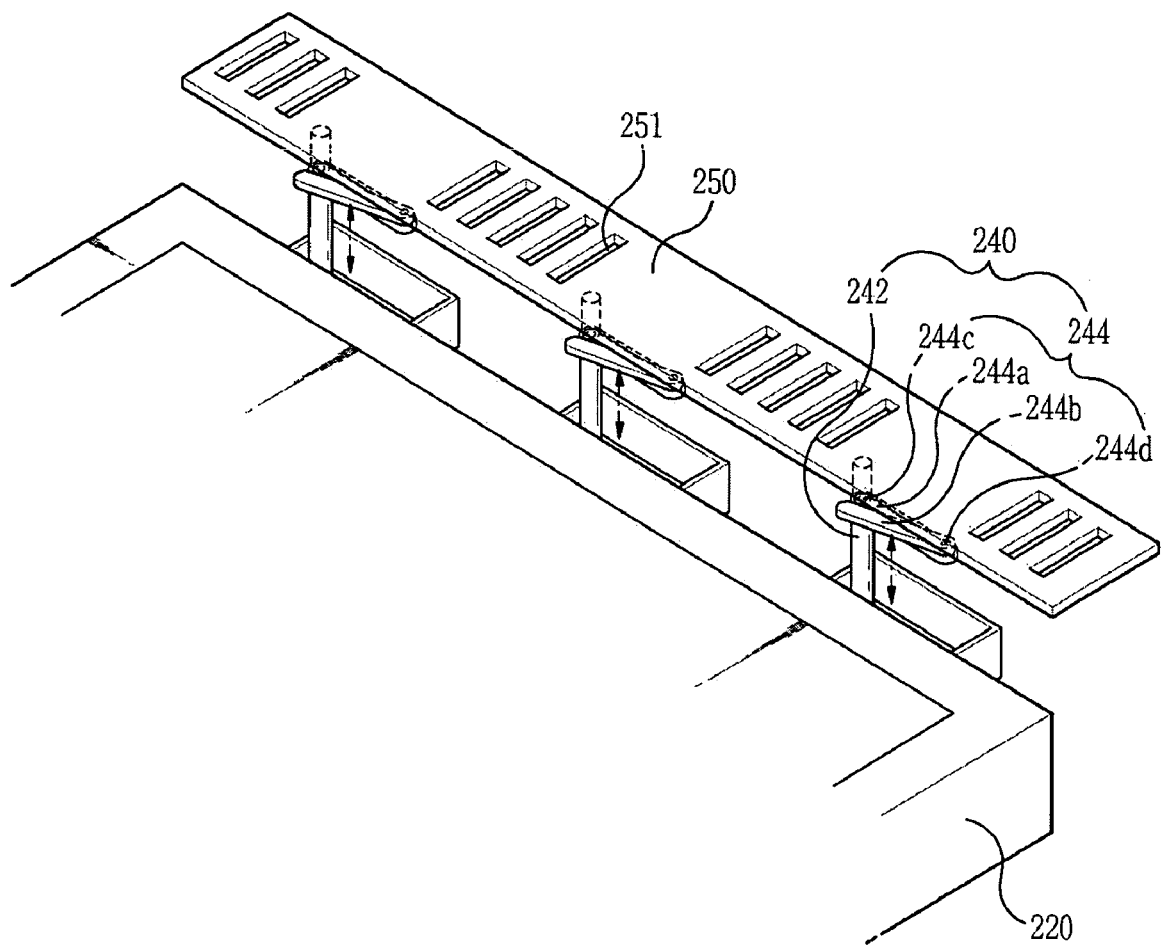

After plasma processing is completed, and a process gas is discharged through a discharge system, the driving shaft 242 is driven to raise the substrate supporting member 244 and the baffle 250, as shown in FIG. 6b. At this time, the shielding portion 246 remains at the side of the substrate mounting table 220.

Figure 6C:
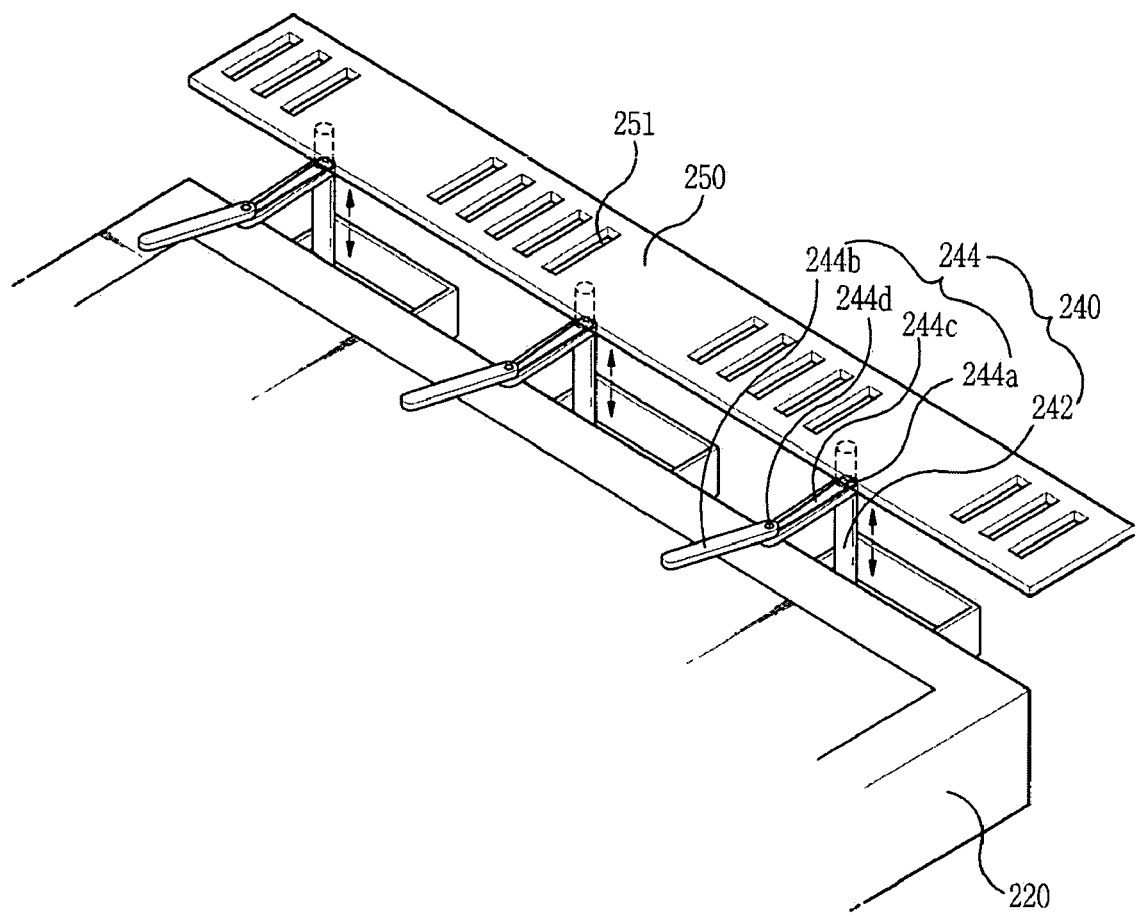

When the substrate supporting member 244 is completely raised to a height to support the substrate, the substrate supporting member 244 is driven to pivot the inner supporting bar 244a and the outer supporting bar 244b, as shown in FIG. 6c. At this time, the inner supporting bar 244a pivots 90 degrees to the driving shaft, and the outer supporting bar 244b pivots 180 degrees to the second joint. Thus, if a pivoting speed of the outer supporting bar 244b is increased to twice the pivoting speed of the inner supporting bar 244a, the outer supporting bar 244b pivots to a location inline with the inner supporting bar 244a when the inner supporting bar 244a pivots to a location perpendicular to the side surface of the substrate mounting table 220.

With this procedure, the substrate supporting member 144 is completely unfolded, and serves to convey the substrate in or out while supporting the substrate. After completing conveyance of the substrate, the outer lifting bar 240 and the baffle 250 return to their original locations at the side of the substrate mounting table 220 via to the inverse of the procedure as described above.

One of the advantages of the present invention is that, since the plasma processing apparatus comprises an outer lifting bar having a simple structure, it is possible to protect a substrate supporting member from plasma.

Another advantage of the present invention is that, since the baffle and the outer lifting bar are driven at the same time, it is possible to completely prevent interference between the baffle and the outer lifting bar during operation thereof, and to perform a plasma process while adjusting a height of the baffle.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention according to the accompanying claims.

What is claimed is:

1. A plasma processing apparatus for performing a predetermined process on a substrate using plasma, comprising:
 a chamber;
 a substrate mounting table equipped within the chamber to place the substrate thereon;
 an outer lifting bar provided at an outer side of the substrate mounting table to move up and down, and serving to temporarily support the substrate above the substrate mounting table,
 a baffle provided to shield a space formed between the substrate mounting table and a side wall of the chamber, and having a plurality of through holes formed on a predetermined portion of the baffle,
 the outer lifting bar comprising,
  a driving shaft moving up and down,
  a substrate supporting member coupled perpendicular to an upper end of the driving shaft the substrate supporting member being disposed above the substrate mounting table by pivoting the substrate supporting member about the driving shaft to a position above the substrate mounting table,
  shielding portion coupled to a side wall of the substrate mounting table, the shielding portion being opened at an upper surface to allow the substrate supporting member to move through the upper surface and be received in the shield portion, wherein the baffle and the substrate supporting member are driven vertically at the same time by the driving shaft.

2. The plasma processing apparatus according to claim 1, wherein the substrate supporting member is a foldable substrate supporting member comprising:

an inner supporting bar coupled to the upper end of the driving shaft;

an outer supporting bar coupled to a distal end of the inner supporting bar;

a first joint coupling the inner supporting bar to the driving shaft to allow the inner supporting bar to pivot about the driving shaft; and a second joint coupling the inner supporting bar and the outer supporting bar to allow the outer supporting bar to pivot.

3. The plasma processing apparatus according to claim 1, wherein, when the driving shaft is lowered, the shielding portion is brought into tight contact with the baffle, and the substrate supporting member is shielded by a space formed between the shielding portion and the baffle.

* * * * *